United States Patent
Shih et al.

(10) Patent No.: US 10,105,737 B2
(45) Date of Patent: Oct. 23, 2018

(54) CLEANING APPARATUS

(71) Applicants: GLOBAL UNICHIP CORPORATION, Hsinchu (TW); TAIWAN SEMICONDUCTOR MANUFACTURING CO., LTD., Hsinchu (TW)

(72) Inventors: Yu-Ting Shih, Kaohsiung (TW); Chun-Ming Wu, Hsinchu (TW); Chia-Jen Kao, Hsinchu (TW)

(73) Assignees: GLOBAL UNICHIP CORPORATION, Hsinchu (TW); TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 283 days.

(21) Appl. No.: 15/093,720

(22) Filed: Apr. 7, 2016

(65) Prior Publication Data
US 2017/0165718 A1    Jun. 15, 2017

(30) Foreign Application Priority Data
Dec. 10, 2015   (CN) .......................... 2015 1 0915300

(51) Int. Cl.
*B08B 1/00*  (2006.01)
*H01L 21/67*  (2006.01)
*H05K 13/00*  (2006.01)

(52) U.S. Cl.
CPC ........ *B08B 1/005* (2013.01); *H01L 21/67011* (2013.01); *H05K 13/0092* (2013.01)

(58) Field of Classification Search
CPC .............. B08B 1/005; H01L 21/67011; H05K 13/0092
See application file for complete search history.

(56) References Cited

U.S. PATENT DOCUMENTS

| | | | |
|---|---|---|---|
| 5,972,736 A * | 10/1999 | Malladi | H01L 23/24 257/675 |
| 6,085,804 A * | 7/2000 | Choi | H05K 13/0092 140/105 |
| 8,790,466 B2 * | 7/2014 | Humphrey | B08B 1/00 134/6 |
| 2006/0200921 A1 * | 9/2006 | Shih | B08B 1/04 15/21.1 |

FOREIGN PATENT DOCUMENTS

| CN | 101773921 A | 7/2010 |
|---|---|---|
| CN | 202410934 U | 9/2012 |
| TW | 200631678 | 9/2006 |

* cited by examiner

*Primary Examiner* — Marc Carlson
(74) *Attorney, Agent, or Firm* — CKC & Partners Co., Ltd.

(57) ABSTRACT

A cleaning apparatus includes a case and a cleaning head. The cleaning head is disposed on the case, and provided with a plurality of tines. The tines are separately arranged abreast. The tines are used to extend into gaps between plural conductive terminals of a semiconductor product for cleaning the semiconductor product.

13 Claims, 8 Drawing Sheets

Fig. 9D

CLEANING APPARATUS

RELATED APPLICATIONS

This application claims priority to China Application Serial Number 201510915300.7, filed Dec. 10, 2015, which is herein incorporated by reference.

BACKGROUND

Field of Disclosure

The present disclosure relates to a cleaning apparatus. More particularly, the present disclosure relates to a cleaning apparatus for cleaning semiconductor products.

Description of Related Art

A semiconductor product includes a substrate and a plurality of conductive terminals arranged on the substrate at intervals. The semiconductor product bonds to soldering pads of a circuit board with the conductive terminals, so that the semiconductor product can exchange signals with the circuit board. However, while a soldering or de-soldering step is processed, dirt or solder dross may unavoidably form in the gaps between the conductive terminals which may cause a short or create poor contact between the conductive terminals.

Recently, operators only can scrape the dirt or the solder dross away with tools (e.g., knives or screw drivers) on hand for removing the dirt or the solder dross between the conductive terminals. Therefore, not only a lot of working time will be consumed, but also the conductive terminals of the semiconductor product or the circuits of the substrate may be damaged to further affect the original electrical performance of the semiconductor product.

Therefore, ways in which to provide a solution to effectively solve the aforementioned inconvenience and shortages and to increase the competitiveness of industries will be seriously concerned.

SUMMARY

An aspect of the disclosure is to provide a cleaning apparatus to overcome the defects and inconvenience of the prior art.

According to one embodiment, the cleaning apparatus is suitable for cleaning a semiconductor product in which the semiconductor product includes a plurality of conductive terminals arranged at intervals, and gaps are formed between the conductive terminals. The cleaning apparatus includes a case and a cleaning head. The cleaning head includes a main body and a plurality of tines. The tines are separately arranged on the main body abreast, for respectively extending into the gaps of the conductive terminals. A space formed between two neighboring ones of the tines is configured to only receive single one of the conductive terminals of the semiconductor product.

Therefore, the cleaning apparatus of the embodiment not only cleans the dirt or the solder dross between the conductive terminals quickly, but also avoids from damaging the conductive terminals of the semiconductor product or the circuits of the substrate so as to further affect the original electrical performance of the semiconductor product.

In one or more embodiments of the present disclosure, the tines are adjustably arranged on the main body such that space intervals formed between the tines are adjustable.

In one or more embodiments of the present disclosure, the main body includes an expandable assembly and an adjustment portion. The expandable assembly is expandably disposed in the case. The expandable assembly extends in an axial direction, and the tines are arranged abreast on one side of the expandable assembly in the axial direction such that space intervals formed between the tines are correspondingly adjustable when the expandable assembly extends. The adjustment portion is movably disposed on the case, and connected to the expandable assembly for controlling the expansion of the expandable assembly.

In one or more embodiments of the present disclosure, the expandable assembly includes a plurality of shafts, a plurality of first connecting rods, a plurality of second connecting rods, a plurality of third connecting rods and a plurality of fourth connecting rods. The shafts are respectively connected to the tines. A longitudinal axis of each of the tines at least intersects a longitudinal axis of each of the shafts. One end of each of the second connecting rods is pivotally connected to one end of each of the first connecting rods with one of the shafts. An intermediate region of each of the third connecting rods is pivotally connected to an intermediate region of each of the first connecting rods. One end of the fourth connecting rods is pivotally connected to one end of each of the third connecting rods with another of the shafts, and an intermediate region of each of the fourth connecting rods is pivotally connected to an intermediate region of each of the second connecting rods. The adjustment portion connects to the other end of one of the first connecting rods and the other end of one of the third connecting rods. Thus, when the adjustment portion rotates the first connecting rods, the second connecting rods, the third connecting rods and the fourth connecting rods so that the intermediate regions of the first connecting rods and the intermediate regions of the fourth connecting rods are mutually closed, the expandable assembly reduces the space intervals of the tines.

In one or more embodiments of the present disclosure, the expandable assembly includes a Z-type folded elastic body. Two opposite ends of the Z-type folded elastic body are respectively connected to the case and the adjustment portion. The Z-type folded elastic body includes a plurality of first sheet body portions and a plurality of second sheet body portions. The first sheet body portions and the second sheet body portions are respectively connected in turn. Each of the first sheet body portions and one of the second sheet body portions being adjacently connected to the first sheet body portion respectively form a connecting edge. A longitudinal axis of each of the tines at least intersects a longitudinal axis of each of the connecting edges. Thus, when the adjustment portion presses the Z-type folded elastic body so that the first sheet body portions and the second sheet body portions are mutually closed, the expandable assembly reduces the space intervals of the tines.

In one or more embodiments of the present disclosure, the adjustment portion is a slider block. The slider block is slidably disposed on the case and connected to one end of the expandable assembly for adjusting the space intervals of the tines by controlling the expansion of the expandable assembly.

In one or more embodiments of the present disclosure, the tines are equidistantly arranged abreast on the main body. The space intervals of the tines are the same. The case is provided with a scale neighboring to the slider block. The scale includes a plurality of scale values respectively representing different sizes of the space intervals of the tines.

In one or more embodiments of the present disclosure, the expandable assembly is resilient. The adjustment portion is a rotatable screw bolt rotatably disposed on the case and abutted to one end of the expandable assembly for adjusting the space intervals of the tines by controlling the expansion of the expandable assembly.

In one or more embodiments of the present disclosure, the tines are equidistantly arranged abreast on the main body. The space intervals of the tines are the same. The rotatable screw bolt is provided with a scale. The scale includes a plurality of scale values respectively representing different sizes of the space intervals of the tines.

In one or more embodiments of the present disclosure, the tines are fixedly disposed on the main body such that space intervals formed between the tines are constant.

In one or more embodiments of the present disclosure, the cleaning head is detachably disposed on the case.

In one or more embodiments of the present disclosure, the tines are equidistantly arranged abreast on the main body, wherein the space intervals of the tines are the same.

In one or more embodiments of the present disclosure, the tines include antistatic material.

In one or more embodiments of the present disclosure, each of the tines is in a linear shape, a hook shape, an L type shape or a needle shape.

In one or more embodiments of the present disclosure, one distal end of each of the tines is provided with a needle peak portion or a flat panel.

It is to be understood that both the foregoing general description and the following detailed description are by examples, and are intended to provide further explanation of the disclosure as claimed.

BRIEF DESCRIPTION OF THE DRAWINGS

The accompanying drawings are included to provide a further understanding of the disclosure, and are incorporated in and constitute a part of this specification. The drawings illustrate embodiments of the disclosure and, together with the description, serve to explain the principles of the disclosure. In the drawings.

DESCRIPTION OF THE EMBODIMENTS

Reference will now be made in detail to the present embodiments of the disclosure, examples of which are illustrated in the accompanying drawings. Wherever possible, the same reference numbers are used in the drawings and the description to refer to the same or like parts. According to the embodiments, it will be apparent to those skilled in the art that various modifications and variations can be made to the structure of the present disclosure without departing from the scope or spirit of the disclosure.

Figure 1:
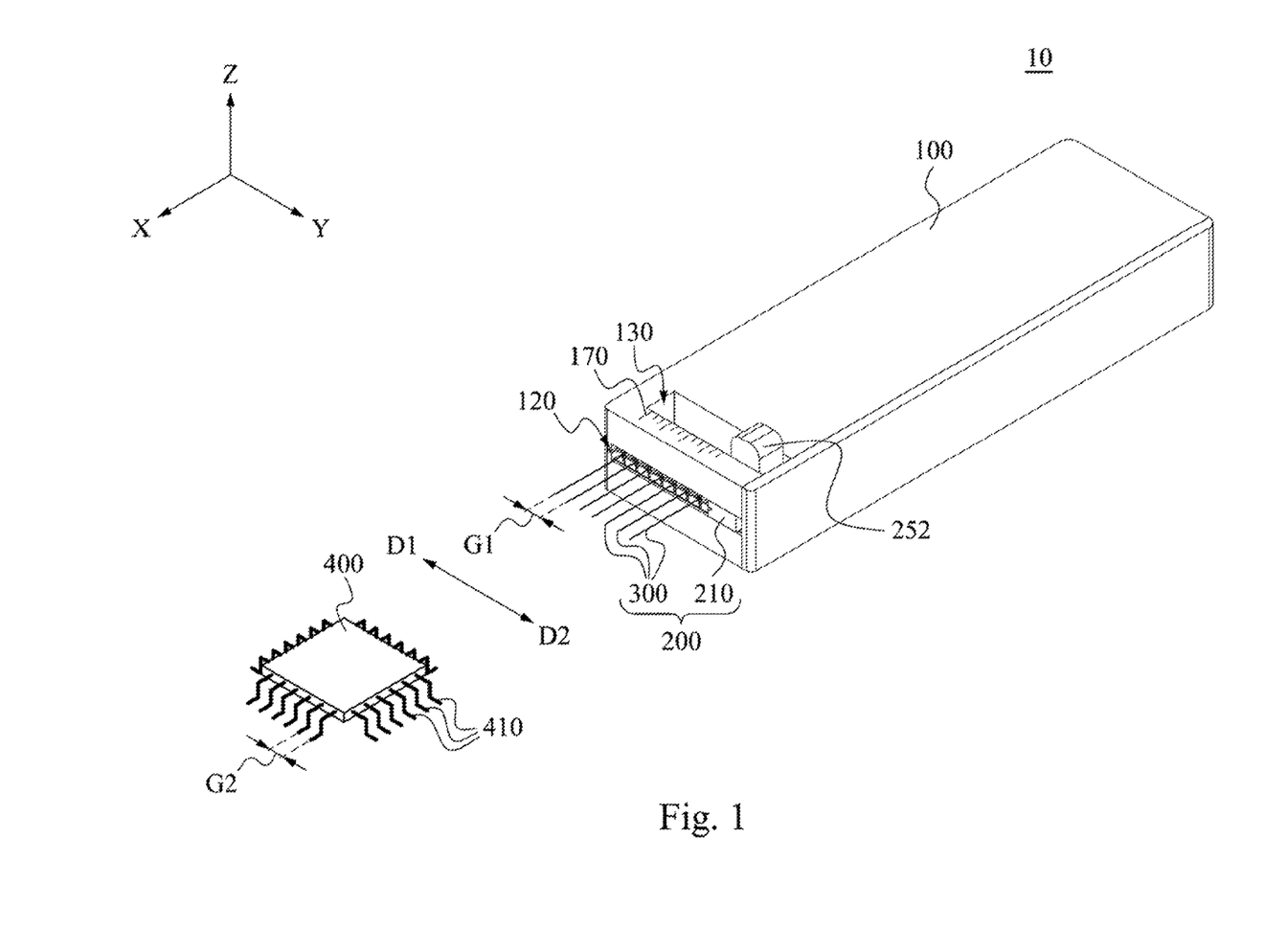
FIG. 1 is a schematic view of a cleaning apparatus and a semiconductor product to be cleaned according to an embodiment of the disclosure.
Figure 2:
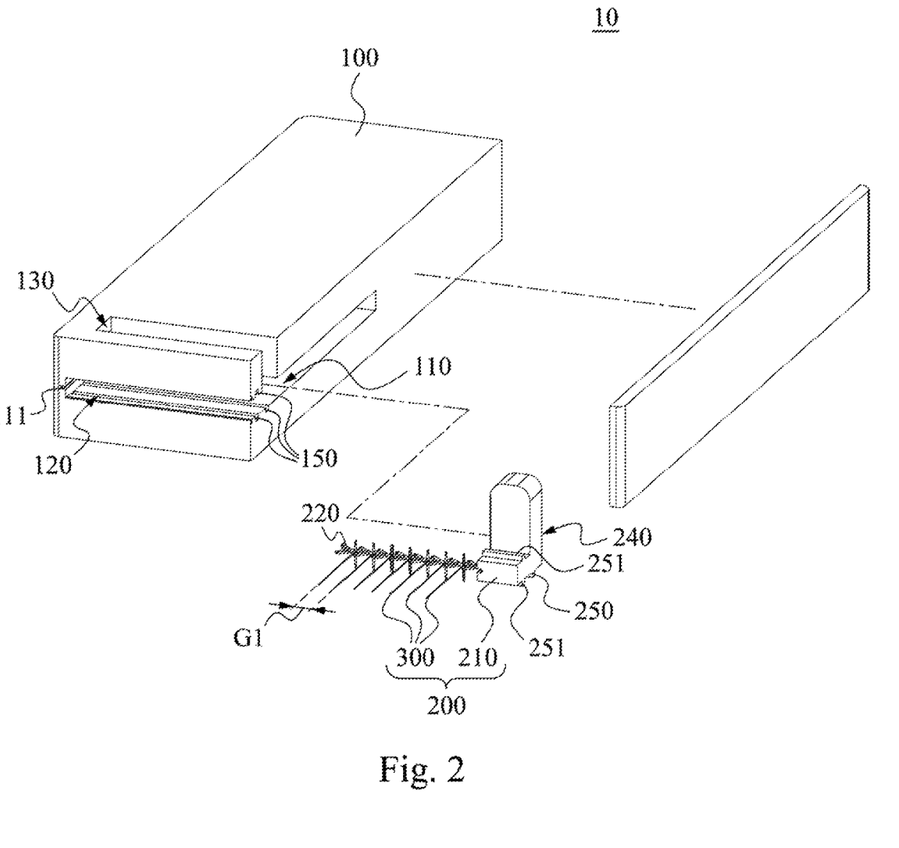
FIG. 2 is a disassembled view of the cleaning apparatus of FIG. 1.

Reference is now made to FIG. 1 and FIG. 2 in which FIG. 1 is a schematic view of a cleaning apparatus 10 and a semiconductor product to be cleaned according to an embodiment of the disclosure, and FIG. 2 is a disassembled view of the cleaning apparatus 10 of FIG. 1. As shown in FIG. 1 and FIG. 2, the cleaning, apparatus 10 is suitable for cleaning a semiconductor product. The cleaning apparatus 10 includes a case 100 and a cleaning head 200. The cleaning head 200 includes a main body 210 and a plurality of tines 300. The main body 210 is disposed on the case 100. The tines 300 are separately arranged on the main body 210 abreast, so that each space interval G1 is formed between every two neighboring tines 300. In the embodiment, the tines 300 are arranged on the main body 210 abreast in a single row, and the tines 300 are equidistantly arranged abreast on the main body 210, that is, the space intervals G1 of the tines 300 are the same. However, the disclosure is not limited thereto, in other embodiments, the tines do not have to be equidistantly arranged abreast on the main body in a single row.

In the embodiment, the semiconductor product; for example, is a packaging unit 400. The packaging unit 400 includes a plurality of conductive terminals 410 separately arranged at intervals, so that each gap G2 is formed between every two neighboring conductive terminals 410. For example, each of the gaps G2 of the conductive terminals 410 normally is in 0.2 mm-1.27 mm. Each of the space intervals G1 of the tines 300 normally is in 0.2 mm-3 mm.

Therefore, when the tines 300 respectively extend into the gaps G2 of the conductive terminals 410 one to one for cleaning the gaps G2 of the conductive terminals 410 of the packaging unit 400, the tines 300 not only can quickly clean the dirt or the solder dross in the gaps G2 of the conductive terminals 410 of the packaging unit 400, but also can avoid from damaging the conductive terminals 410 of the packaging unit 400 or the circuits thereof so as to avoid from further affecting the original electrical performance of the packaging unit 400.

It is noted that when the tines 300 respectively extend into the gaps G2 of the conductive terminals 410 one to one, each space (see space interval G1) formed between two neighboring tines 300 is configured to only receive single one of the conductive terminals 410 of the packaging unit 400.

However, the disclosure is not limited thereto, in other embodiments, each space interval does not have to only receive single one conductive terminal of the packaging unit. Also, the semiconductor product of the disclosure is not limited to the packaging unit, in other embodiments, the semiconductor product may also be a circuit board (now shown).

In the embodiment, the tines 300 are adjustably arranged on the main body 210 such that space intervals G1 of the tines 300 are adjustable. Specifically, for example, the tines 300 are transversely movable on the main body 210. When the tines 300 transversely move, the space intervals G1 of the tines 300 can be therefore enlarged or reduced simultaneously.

Figure 3:
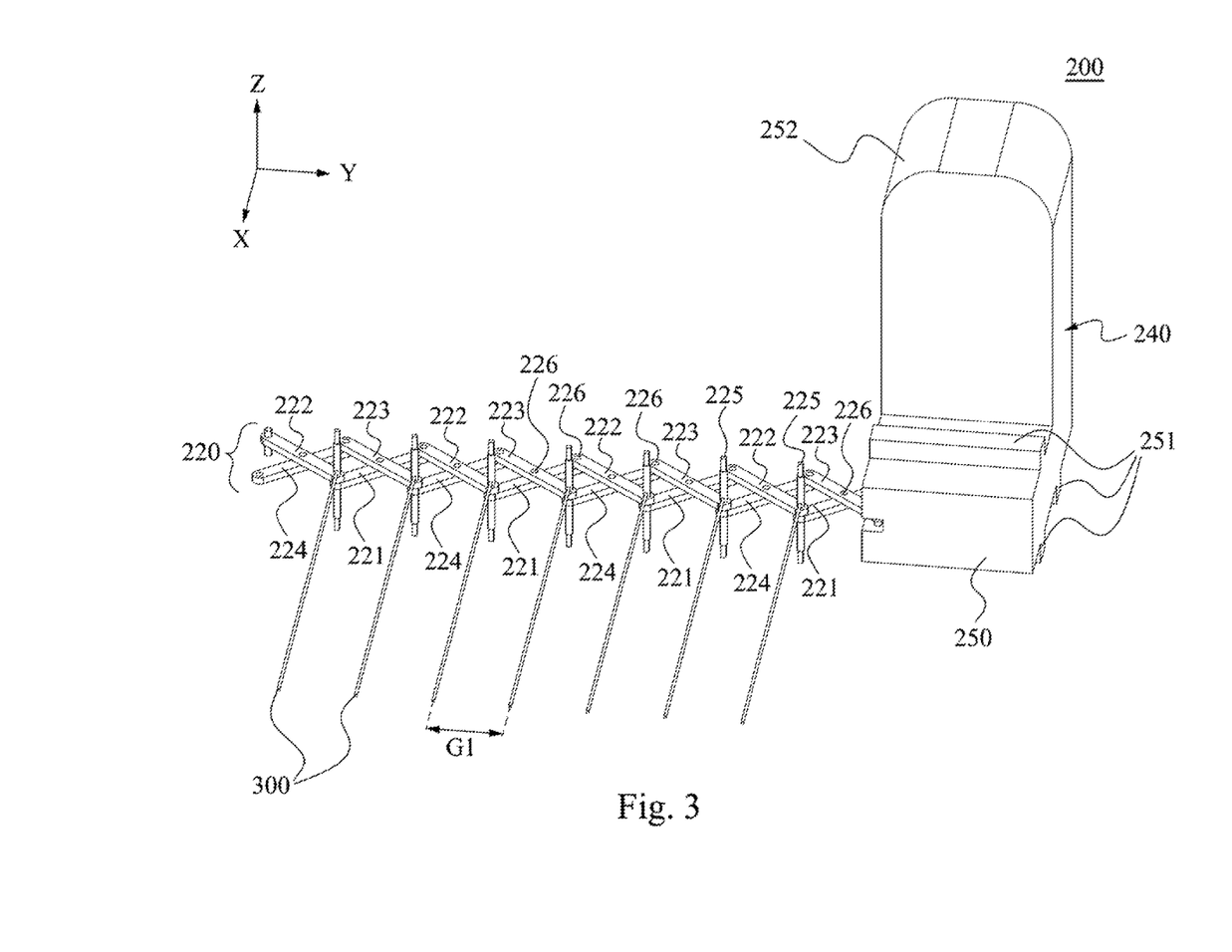
FIG. 3 is a partially enlarged view of a cleaning head of FIG. 2.
Figure 4:
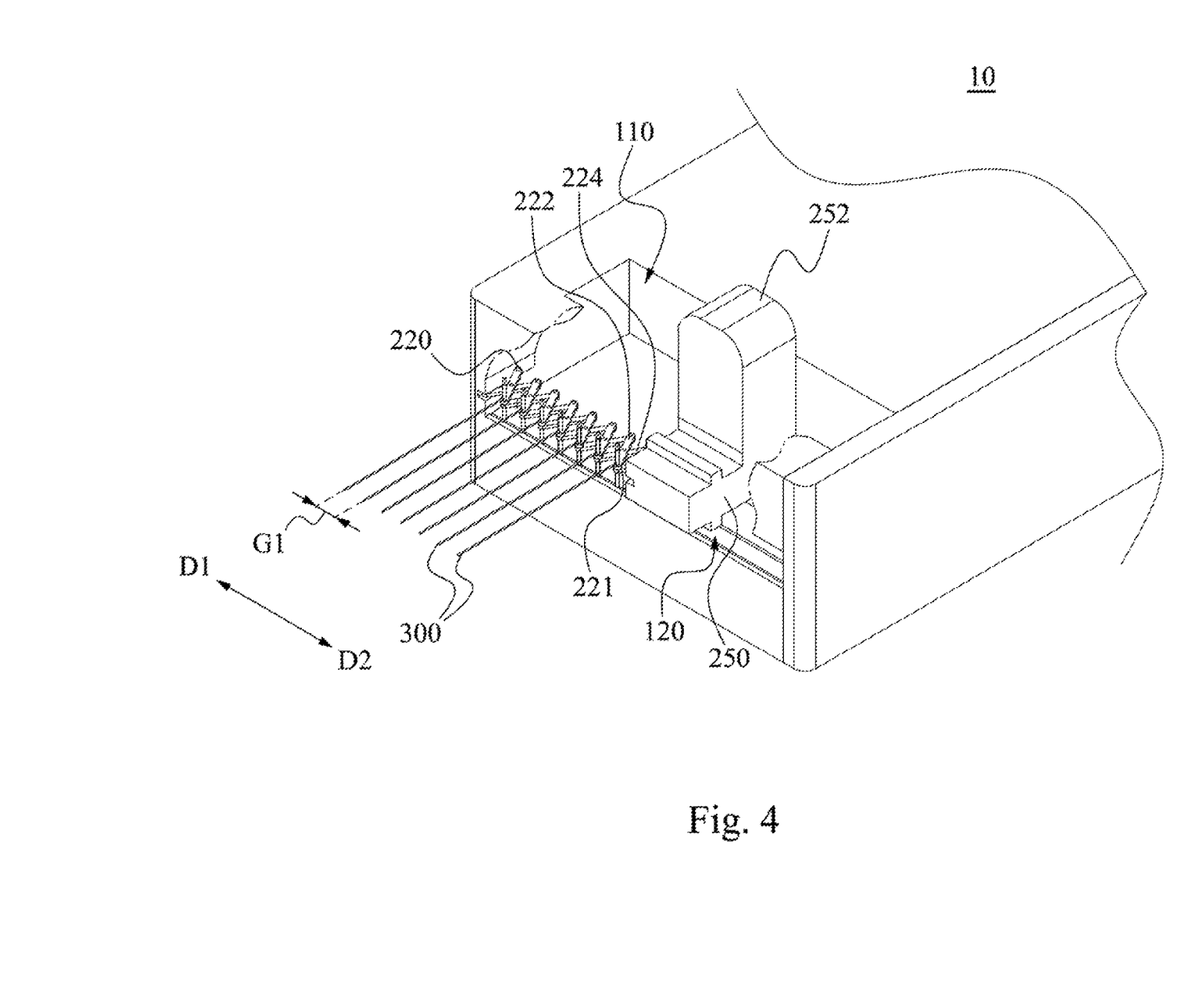
FIG. 4 is an operation view of the cleaning apparatus of FIG. 1.

Reference is now made to FIG. 3 and FIG. 4 in which FIG. 3 is a partially enlarged view of a cleaning head 200 of FIG. 2, and FIG. 4 is an operation view of the cleaning apparatus 10 of FIG. 1. As shown in FIG. 2 and FIG. 3, the case 100 is provided with a containing recess 110, a first opening 120 and a second opening 130. The containing recess 110 is formed in the case 100. The first opening 120 is formed on one side of the case 100 and is in communication with the containing recess 110. The second opening 130 is formed on another side of the case 100 and is in communication with the containing recess 110. The main body 210 includes an adjustment portion 240 and an expandable assembly (e.g., expandable cross-stick rack 220). The expandable assembly is expandably disposed in the case 100. The expandable assembly extends in an axial direction (axis Y), and the tines 300 are arranged abreast on one side of the expandable assembly in the axial direction (axis Y), so that space intervals G1 of the tines 300 are correspondingly adjustable as the expandable assembly is operated to extend. The adjustment portion 240 is movably disposed on the case 100, and connected to the expandable assembly for controlling the expansion of the expandable assembly.

For example, the expandable assembly is an expandable cross-stick rack 220 expandably disposed in the containing recess 110 of the case 100. Two opposite ends of the expandable cross-stick rack 220 are respectively connected to the adjustment portion 240 and an inner surface 111 of the case 100. The tines 300 are connected to one side of the expandable cross-stick rack 220 abreast, and the tines 300 extend outwards from the containing recess 110 of the case 100 via the first opening 120. The adjustment portion 240 movably connects to the case 100 and the expandable cross-stick rack 220 to dynamically operate the expandable assembly and further adjust the space intervals G1 of the tines 300.

More specifically, as shown in FIG. 3, the adjustment portion 240 is a slider block 250. The slider block 250 is slidably disposed on the case 100, and the slider block 250 is connected to one end of the expandable cross-stick rack 220 for adjusting the space intervals G1 of the tines 300 by controlling the expansion of the expandable cross-stick rack 220. For example, the slider block 250 is slidably connected to the case 100 and the expandable cross-stick rack 220. The slider block 250 includes at least one slide rail portion 251 and an operating member 252. The case 100 includes a sliding groove portion 150. As the slide rail portion 251 of the slider block 250 engaged with the sliding groove portion 150 of the case 100, the slider block 250 can slide back and forth in the containing recess 110 of the case 100 so as to dynamically retract or extend the expandable assembly. The operating member 252 of the slider block 250 extends outwards from the case 100 via the second opening 130 to allow users to operate sliding.

Thus, no matter the sizes of the gaps of the conductive terminals of the packaging unit can be different, the expandable assembly (the expandable cross-stick rack 220) can be extended or retracted to adjust the space intervals of the tines correspondingly, so as to facilitate the users to immediately clean in the gaps of the conductive terminals of the packaging unit.

In the embodiment, the expandable cross-stick rack 220 includes a plurality of first connecting rods 221, a plurality of second connecting rods 222, a plurality of third connecting rods 223 and a plurality of fourth connecting rods 224. The first connecting rods 221, the second connecting rods 222, the third connecting rods 223 and the fourth connecting rods 224 are pivotally connected to each other through shafts 226. Specifically, the adjustment portion 240 connects to one end of the first one of the first connecting rods 221 being away from the second connecting rods 222, and one end of the first one of the third connecting rods 223 being away from the fourth connecting rods 224. The inner surface 111 of the case 100 connects one end of the last one of the second connecting rods 222 being away from the first connecting rods 221, and one end of the last one of the fourth connecting rods 224 being away from the third connecting rods 223. In the rest of the first to fourth connecting rods 221, 222, 223 and 224, two opposite ends of the first connecting rods 221 are respectively pivotally connected to one end of two second connecting rods 222; two opposite ends of the second connecting rods 222 are respectively pivotally connected to one end of two first connecting rods 221; two opposite ends of the third connecting rods 223 are respectively pivotally connected to one end of two fourth connecting rods 224; and two opposite ends of the fourth connecting rods 224 are respectively pivotally connected to one end of two third connecting rods 223.

Furthermore, an intermediate region of one of the third connecting rods 223 is pivotally connected to an intermediate region of one of the first connecting rods 221 through a pivot 226. An intermediate region of one of the fourth connecting rods 224 is pivotally connected to an intermediate region of one of the second connecting rods 222 through a pivot 226. Particularly, one of the second connecting rods 222 is pivotally connected to one of the first connecting rods 221 through a shaft 225. One of the fourth connecting rods 224 is pivotally connected to one of the third connecting rods 223 through another shaft 225. The shaft 225 is longer than the pivot 226, and the shaft 225 connects to one of the tines 300, and a longitudinal axis (e.g., axis X) of each of the tines 300 at least intersects a longitudinal axis (e.g., axis Z) of each of the shafts 225.

Therefore, FIG. 4 is an operation view of the cleaning apparatus 10 of FIG. 1. As shown in FIG. 3 and FIG. 4, when a user moves the operating member 252 in a first direction D1, the user moves the slider block 250 to push the expandable cross-stick rack 220 towards the first direction D1 for rotating the first to fourth connecting rods 221, 222, 223 and 224 so that each intermediate region of the first connecting rods 221 (refer to the position of the first connecting rod 221 where the pivot 226 is positioned, FIG. 3) and each intermediate region of the fourth connecting rods 224 are mutually getting closed, thus, the expandable cross-stick rack 220 reduces the space intervals G1 of the tines 300; on the contrary, when a user moves the operating member 252 in a second direction D2 opposite to the first direction D1, the expandable cross-stick rack 220 enlarges the space intervals G1 of the tines 300 (FIG. 1).

However, the disclosure is not limited thereto. The adjustment portion does not have to be a slider block when the expandable assembly is the expandable cross-stick rack. In other embodiments, the adjustment portion also can be a rotatable bolt for pressing or releasing the expandable assembly to enlarge or reduce the space intervals of the tines by rotating the rotatable bolt forwards or in reverse.

Furthermore, as shown in FIG. 1, the case 100 is provided with a scale 170, and the scale 170 is disposed on a surface of the case 100 neighboring to the slider block 250. The scale 170 includes a plurality of scale values respectively representing different sizes of the space intervals G1 of the tines 300. For example, when the slider block 250 is moved to direct to one of the scale values, the size of the space intervals G1 of the tines 300 is exactly indicated by the corresponding scale value.

Figure 5:
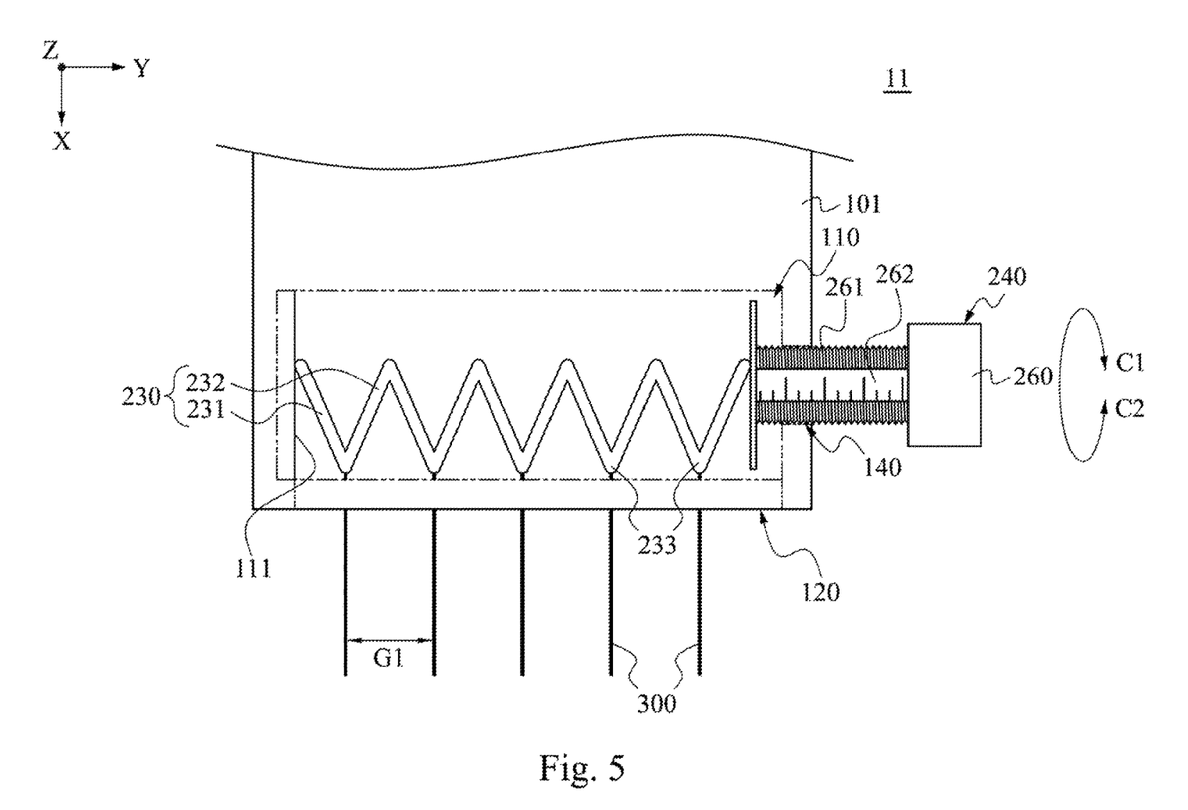
FIG. 5 and FIG. 6 are schematic views of a cleaning apparatus according to an embodiment of the disclosure.
Figure 6:
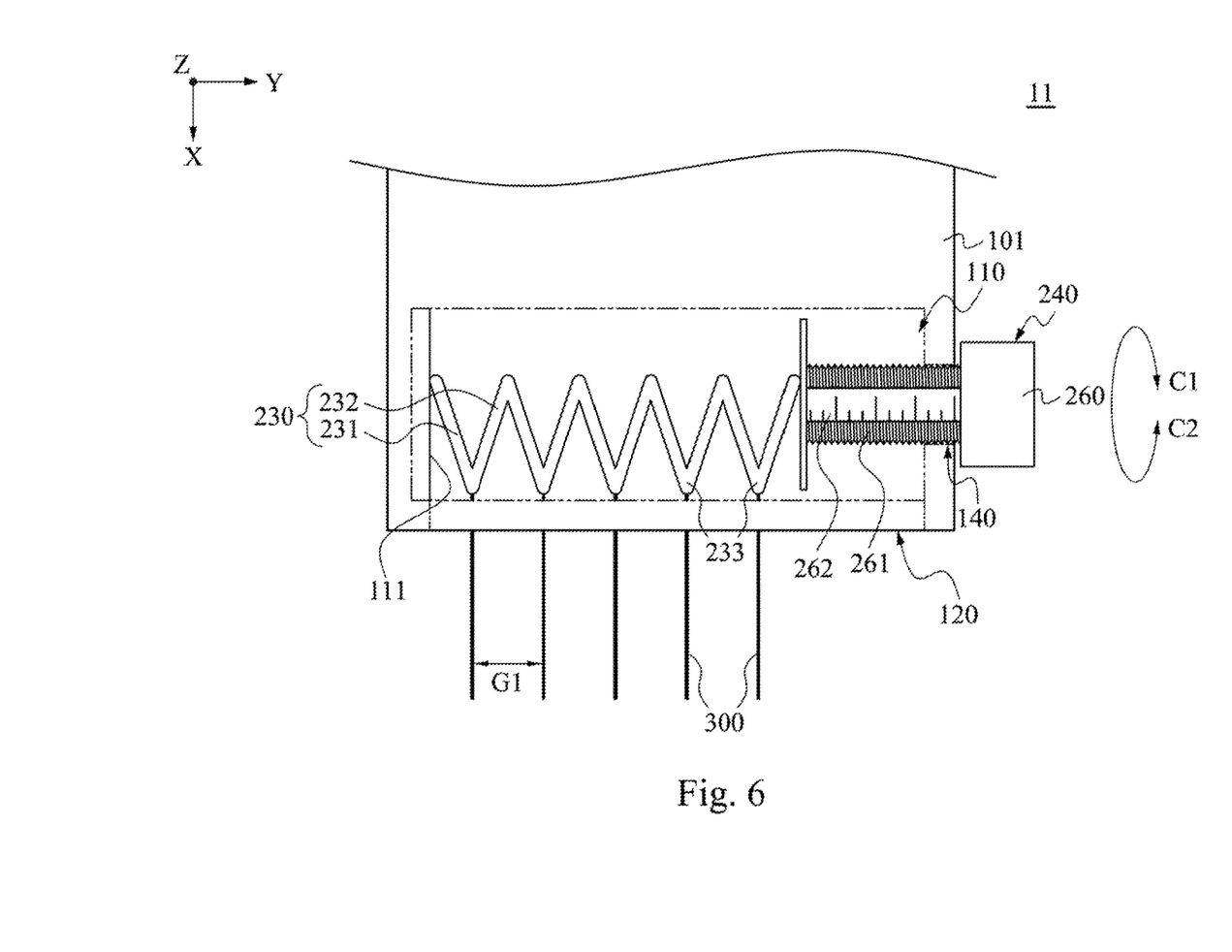

Reference is now made to FIG. 5 and FIG. 6 in which FIG. 5 and FIG. 6 are schematic views of a cleaning apparatus 12 according to an embodiment of the disclosure. As shown in FIG. 5, in this embodiment, the expandable assembly includes a Z-type folded elastic body 230 (or accordion type elastic body). Two opposite ends of the Z-type folded elastic body 230 are respectively connected to the case 100 and the adjustment portion 240. The Z-type folded elastic body 230 includes a plurality of first sheet body portions 231 and a plurality of second sheet body portions 231. The first sheet body portions 231 and the second sheet body portions 232 are respectively connected in turn. Each of the first sheet body portions 231 and one of the second sheet body portions 232 being adjacently connected to the first sheet body portion 231 respectively form a connecting edge 233. The tines 300 are respectively connected to a part of the connecting edges 233 arranged on the same side of the Z-type folded elastic body 230. A longitudinal axis (e.g., axis X) of each of the tines 300 at least intersects a longitudinal axis (e.g. axis Z) of each of the connecting edges 233 of the Z-type folded elastic body 230. The adjustment portion 240 is connected to one end of the Z-type folded elastic body 230.

FIG. 5 is shown in great detail, besides the containing recess 110 and the first opening 120, the case 101 further includes a third opening 140 formed on another surface of the case 101 and being in communication with the containing recess 110. The adjustment portion 240 is a rotatable screw bolt 260 rotatably disposed on the case 101. One end of the rotatable screw bolt 260 abuts to one end of the Z-type folded elastic body 230, the other end of the rotatable screw bolt 260 extends outwards from the case 101 via the third opening 140 for users to rotate. Thus, no matter the sizes of the gaps of the conductive terminals of the packaging unit can be different, the Z-type folded elastic body can be extended or retracted to adjust the space intervals of the tines correspondingly, so as to facilitate the users to immediately clean in the gaps of the conductive terminals of the packaging unit.

Therefore, as shown in FIG. 6, when a user rotates the rotatable screw bolt 260 in a first clock direction C1 to move the rotatable screw bolt 260 into the containing recess 110 gradually, the rotatable screw bolt 260 presses the Z-type folded elastic body 230 so that the first sheet body portions 231 and the second sheet body portions 232 becomes mutual closed to reduce the space intervals G1 of the tines 300; on the contrary, when the user rotates the rotatable screw bolt 260 in a second clock direction C2 being opposite to the first clock direction C1 to move the rotatable screw bolt 260 away from the containing recess 110 gradually, the rotatable screw bolt 260 releases the Z-type folded elastic body 230 so that the first sheet body portions 231 and the second sheet body portions 232 become mutually further apart. Since the Z-type folded elastic body 230 is resumed, the Z-type folded elastic body 230 enlarges the space intervals G1 of the tines 300.

Furthermore, as shown in FIG. 1, the rotatable screw bolt 260 is provided with a scale 262. The scale 262 is disposed on a circumferential surface 261 of the rotatable screw bolt 260. The scale 262 includes a plurality of scale values respectively representing different sizes of the space intervals G1 of the tines 300. For example, when the rotatable screw bolt 260 is partially moved outwards from the case 101 via the third opening 140 to expose one of the scale values of the scale 262, the size of the space intervals G1 of the tines 300 is exactly indicated by the exposed scale value.

However, the disclosure is not limited thereto. The adjustment portion does not have to be a rotatable screw bolt when the expandable assembly is the Z-type folded elastic body. In other embodiments, the adjustment portion also can be a slider block for pressing or releasing the expandable assembly to enlarge or reduce the space intervals of the tines by moving the slider block forward or in reverse.

Figure 7:
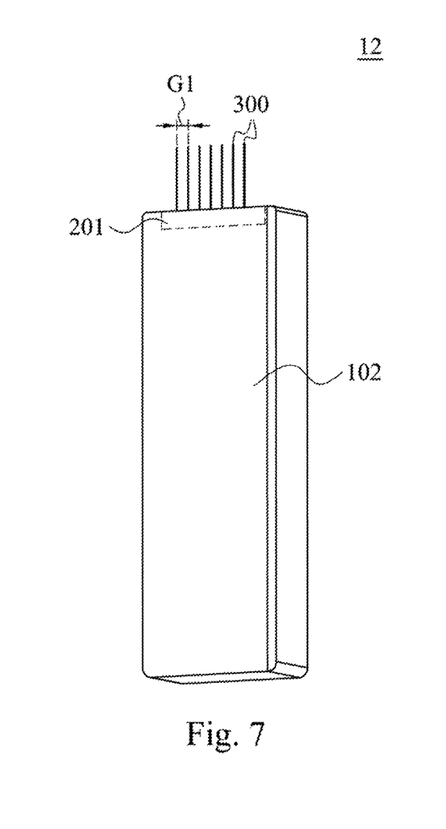
FIG. 7 is a schematic view of a cleaning apparatus according to an embodiment of the disclosure.

FIG. 7 is a schematic view of a cleaning apparatus 12 according to an embodiment of the disclosure. As shown in FIG. 7, the cleaning apparatus 12 of the embodiment is substantially the same as the cleaning apparatus 10, 11 of the aforementioned embodiments, except that the cleaning head 201 of the cleaning apparatus 12 is fixedly disposed on the case 102, and the tines 300 is fixedly disposed on the cleaning head 201 so that the space intervals G1 of the tines 300 are constant or are unchangeable. Therefore, the tines 300 of the cleaning apparatus 12 have a certain degree of structural strength, thus, not easily damaged in the cleaning process.

Figure 8:
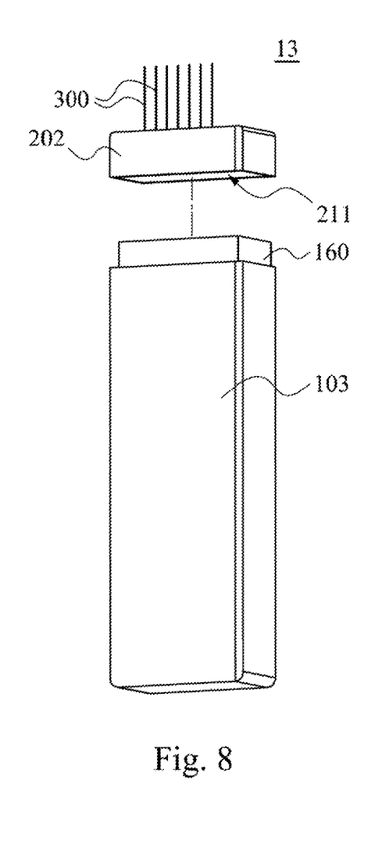
FIG. 8 is a schematic view of a cleaning apparatus according to an embodiment of the disclosure.

Furthermore, FIG. 8 is a schematic view of a cleaning apparatus 13 according to an embodiment of the disclosure. As shown in FIG. 8, the cleaning apparatus 13 of the embodiment is substantially the same as the cleaning apparatus 19, 11 of the aforementioned embodiments, except that the cleaning head 202 is detachably disposed on the case 103. Thus, a user can detach the cleaning head 202 away from the case 103 for substitution or cleaning. For example structures and species of the cleaning head can be modularized for providing cleaning heads with different space intervals.

More particular, the cleaning head 202 includes a first couple portion 211. The first couple portion 211 is formed on one side of the cleaning head 202 opposite to the tines 300. The first couple portion 211 for example can be a slot. The case 103 includes a second couple portion 160. The second couple portion 160 is formed on one side of the case 103, and is cooperatively matched with the first couple portion 211 in shape. The second couple portion 160 for example can be a bump. Therefore, when the first couple portion 211 is engaged with the second couple portion 160, the cleaning head 202 is therefore held on the case 103.

Figure 9A:
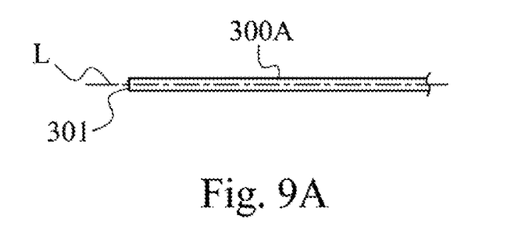
FIG. 9A to FIG. 9D are schematic views of a tine of a cleaning apparatus according to other embodiments of the disclosure.
Figure 9B:
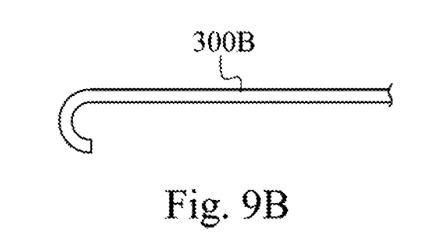
Figure 9C:
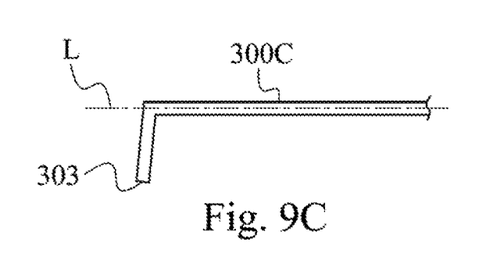
Figure 9D:
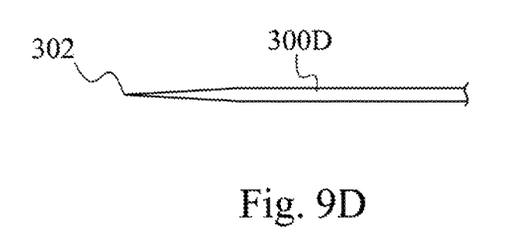

FIG. 9A to FIG. 9D are schematic views of a tine of a cleaning apparatus according to other embodiments of the disclosure. As shown in FIG. 9A, each of the tines 300A is in a linear shape, and the longitudinal axis L of the tines 300A are parallel with each other. However, the disclosure is not limited thereto, in other embodiments, for other requirements or restrictions, as shown in FIG. 9B to FIG. 9D, each of the tines 300B for example can be a tine 300B with a hook shape (FIG. 9B), a tine 300C with an L type shape (FIG. 9C), and a tine 300C with a needle shape (FIG. 9D). The person having ordinary skill in the art may flexibly select the types of the tines according to actual requirements.

Also, in other variations, as shown in FIG. 9A, an end surface of each of the tines 300A is planar, and the longitudinal axis L of the tines 300A passes through a flat panel 301 of the tine 300A. However, the disclosure is not limited thereto, in other embodiments, for other requirements or restrictions, as shown in FIG. 9C, for example, since the tine 300C is with an L type shape (FIG. 9C), the longitudinal axis L of the tines 300C does not pass through a flat panel 303 of the tine 300C; or one distal end of each of the tines 300D is provided with a needle peak portion 302. The person having ordinary skill in the art may flexibly select the types of the distal end of the tines according to actual requirements.

Furthermore, in the embodiments, the tines include metal material or non-metal material, however, as lone as the material of the tines is hard enough for removing dirt or solder dross in the gaps of the conductive terminals of the packaging unit, the disclosure is not limited to the material of the tines. Furthermore, when the tines include antistatic material, the possibility that static electricity damages the packaging unit can be decreased.

In addition, in the aforementioned embodiments, the packaging unit to be cleaned by the cleaning apparatus is not limited in species and model types. For example, the packaging unit can be a quad flat package (QFP), Low/Thin quad flat package (LQFP/TQFP), a quad flat non-leaded package (QFN), a quad flat I-leaded package (QFI), a small outline package (SOP), a thin small outline package (TSOP), a small outline J-lead package (SOJ), a small outline I-lead package (SOI), a ceramic leaded chip carrier (CLCC), a plastic leaded chip carrier (PLCC), a J-leaded chip carrier (JLCC), a single in-line package (SIP), a dual in-line package (DIP), a plastic dual in-line package (P-DIP), a zigzag in-line package (ZIP), a small outline transistor (SOT), a thin small outline transistor (TSOT), a pin grid array (PGA), a ball grid array (BGA), a plastic ball grid array (PBGA), a heat slug ball grid array (HSBGA) or a chip-scale package (CSP). The person having ordinary skill in the art may flexibly select the model types of the packaging unit to be cleaned according to actual requirements.

Although the present disclosure has been described in considerable detail with reference to certain embodiments thereof, other embodiments are possible. Therefore, the spirit and scope of the appended claims should not be limited to the description of the embodiments contained herein.

It will be apparent to those skilled in the art that various modifications and variations can be made to the structure of the present disclosure without departing from the scope or spirit of the disclosure. In view of the foregoing, it is intended that the present disclosure cover modifications and variations of this disclosure provided they fall within the scope of the following claims and their equivalents.

What is claimed is:

1. A cleaning apparatus being applicable to clean a semiconductor product in which the semiconductor product includes a plurality of conductive terminals arranged at intervals, and gaps are formed between the conductive terminals, the cleaning apparatus comprising:
    a case; and
    a cleaning head comprising:
    a main body comprising an expandable assembly expandably disposed in the case, and an adjustment portion movable disposed on the case, and connected to the expandable assembly for controlling an expansion of the expandable assembly; and
    a plurality of tines separately arranged on the main body abreast, for respectively extending into the gaps of the conductive terminals, wherein a space formed between two neighboring ones of the tines is configured to only receive single one of the conductive terminals of the semiconductor product,
    wherein the expandable assembly extends in an axial direction, and the tines are arranged abreast on one side of the expandable assembly in the axial direction such that space intervals formed between the tines are correspondingly adjustable when the expandable assembly extends.

2. The cleaning apparatus of claim 1, wherein the tines are adjustably arranged on the main body such that space intervals formed between the tines are adjustable.

3. The cleaning apparatus of claim 1, wherein the expandable assembly comprises:
    a plurality of shafts respectively connected to the tines, and a longitudinal axis of each of the tines at least intersects a longitudinal axis of each of the shafts;
    a plurality of first connecting rods;
    a plurality of second connecting rods, one end of each of the second connecting rods pivotally connected to one end of each of the first connecting rods with one of the shafts;
    a plurality of third connecting rods, an intermediate region of each of the third connecting rods pivotally connected to an intermediate region of each of the first connecting rods; and
    a plurality of fourth connecting rods, one end of the fourth connecting rods pivotally connected to one end of each of the third connecting rods with another of the shafts, and an intermediate region of each of the fourth connecting rods pivotally connected to an intermediate region of each of the second connecting rods, wherein the adjustment portion connects to the other end of one of the first connecting rods and the other end of one of the third connecting rods,
    wherein, when the adjustment portion rotates the first connecting rods, the second connecting rods, the third connecting rods and the fourth connecting rods so that the intermediate regions of the first connecting rods and the intermediate regions of the fourth connecting rods are mutually closed, the expandable assembly reduces the space intervals of the tines.

4. The cleaning apparatus of claim 1, wherein the expandable assembly comprises an Z-type folded elastic body, two opposite ends of the Z-type folded elastic body are respectively connected to the case and the adjustment portion, and the Z-type folded elastic body comprises a plurality of first sheet body portions and a plurality of second sheet body portions, the first sheet body portions and the second sheet body portions are respectively connected in turn, each of the first sheet body portions and one of the second sheet body portions being adjacently connected to the first sheet body portion respectively form a connecting edge, a longitudinal axis of each of the tines at least intersects a longitudinal axis of each of the connecting edges,
    wherein, when the adjustment portion presses the Z-type folded elastic body so that the first sheet body portions and the second sheet body portions are mutually closed, the expandable assembly reduces the space intervals of the tines.

5. The cleaning apparatus of claim 1, wherein the adjustment portion is a slider block, the slider block is slidably disposed on the case and connected to one end of the expandable assembly for adjusting the space intervals of the tines by controlling the expansion of the expandable assembly.

6. The cleaning apparatus of claim 5, wherein the tines are equidistantly arranged abreast on the main body, wherein the space intervals of the tines are the same; and
    the case is provided with a scale neighboring to the slider block, the scale comprises a plurality of scale values respectively representing different sizes of the space intervals of the tines.

7. The cleaning apparatus of claim 1, wherein the expandable assembly is resilient, and the adjustment portion is a rotatable screw bolt rotatably disposed on the case and abutted to one end of the expandable assembly for adjusting the space intervals of the tines by pressing the expandable assembly.

8. The cleaning apparatus of claim 7, wherein the tines are equidistantly arranged abreast on the main body, wherein the space intervals of the tines are the same; and
    the rotatable screw bolt is provided with a scale, the scale comprises a plurality of scale values respectively representing different sizes of the space intervals of the tines.

9. The cleaning apparatus of claim 1, wherein the cleaning head is detachably disposed on the case.

10. The cleaning apparatus of claim 1, wherein the tines are equidistantly arranged abreast on the main body, wherein the space intervals of the tines are the same.

11. The cleaning apparatus of claim 1, wherein the tines comprise antistatic material.

12. The cleaning apparatus of claim 1, wherein each of the tines is in a linear shape, a hook shape, an L type shape or a needle shape.

13. The cleaning apparatus of claim 1, wherein one distal end of each of the tines is provided with a needle peak portion or a flat panel.

* * * * *